United States Patent
Miura

(10) Patent No.: US 9,276,053 B2
(45) Date of Patent: Mar. 1, 2016

(54) DISPLAY PANEL, DISPLAY UNIT, AND ELECTRONIC APPARATUS

(75) Inventor: Kiwamu Miura, Kanagawa (JP)

(73) Assignee: JOLED Inc., Tokyo (JP)

( * ) Notice: Subject to any disclaimer, the term of this patent is extended or adjusted under 35 U.S.C. 154(b) by 364 days.

(21) Appl. No.: 13/609,678

(22) Filed: Sep. 11, 2012

(65) Prior Publication Data

US 2013/0100093 A1   Apr. 25, 2013

(30) Foreign Application Priority Data

Oct. 19, 2011   (JP) ................. 2011-230127

(51) Int. Cl.
*H01L 27/32* (2006.01)
*H01L 51/50* (2006.01)

(52) U.S. Cl.
CPC ........ *H01L 27/3276* (2013.01); *H01L 51/5088* (2013.01); *H01L 27/3272* (2013.01)

(58) Field of Classification Search
CPC ..... H01L 51/56; H01L 51/0072; H01L 51/52; H01L 27/3244; H01L 51/0058; H01L 51/0073; H01L 51/0052; H01L 27/32; H01L 51/0061; H01L 51/0074; H01L 51/0085; H01L 27/124; H01L 51/006; H01L 51/0067
USPC ..................... 345/76, 205; 257/88, E51.026
See application file for complete search history.

(56) References Cited

U.S. PATENT DOCUMENTS

| | | | | |
|---|---|---|---|---|
| 7,067,170 | B2 * | 6/2006 | Marcus et al. | 427/66 |
| 2007/0057264 | A1 * | 3/2007 | Matsuda | 257/88 |
| 2010/0084966 | A1 * | 4/2010 | Otsu et al. | 313/504 |

FOREIGN PATENT DOCUMENTS

JP   2008-033193 A   2/2008

* cited by examiner

*Primary Examiner* — Kenneth B Lee, Jr.
(74) *Attorney, Agent, or Firm* — Michael Best & Friedrich LLP

(57) ABSTRACT

A display panel includes: a plurality of pixels arranged in a display region, the pixels each including an organic EL element; and a plurality of electrically-conductive wiring layers each arranged between the pixels. The organic EL element includes a plurality of layers including a hole injection layer and a light emitting layer, the light emitting layer emitting light by recombination of an electron and a hole. The hole injection layer of the plurality of layers is common to the pixels in the display region and is electrically connected to the electrically-conductive wiring layers.

25 Claims, 8 Drawing Sheets

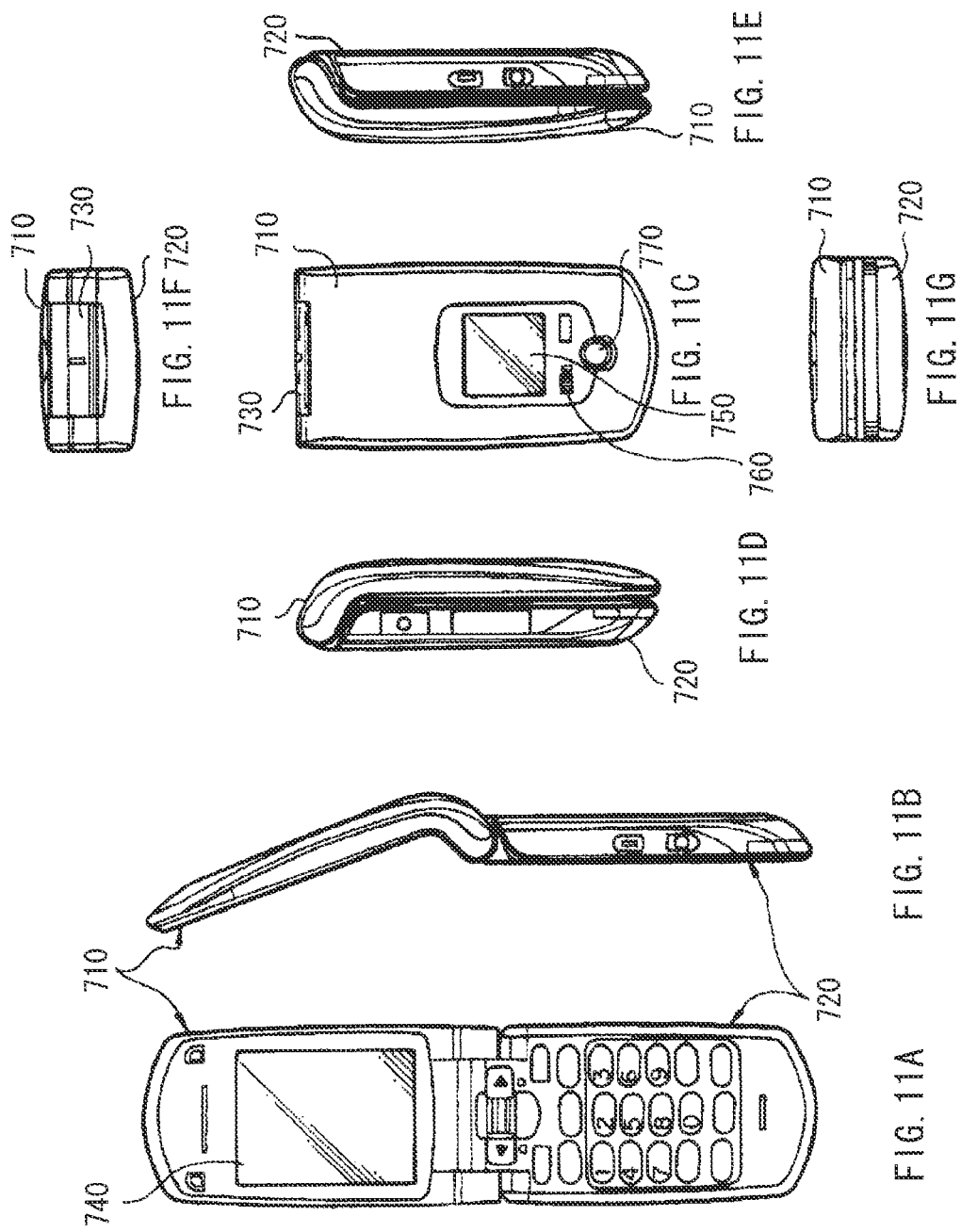

DISPLAY PANEL, DISPLAY UNIT, AND ELECTRONIC APPARATUS

BACKGROUND

The present technology relates to a display panel that includes an organic Electro Luminescence (EL) element for each pixel, and to a display unit that includes the display panel. The present technology also relates to an electronic apparatus that includes the display unit.

Recently, in a field of a display unit that displays an image, a display unit that uses a current-driven optical device as a light emitting device of a pixel is developed and is in commercialization. The current-driven optical device has light emission luminance that varies according to a value of a current flowing therethrough. Examples of the current-driven optical device include an organic EL device. The organic EL device is a self-light-emitting device unlike devices such as a liquid crystal device. Therefore, it is not necessary to provide a light source (backlight) in a display unit (organic EL display unit) that uses an organic EL device. Hence, the organic EL display unit is thinner and has higher luminance compared to a liquid crystal display unit that needs a light source. In particular, when an active matrix scheme is used as a drive scheme, each pixel is allowed to be held in a light emitting state and power consumption is thereby decreased. Therefore, the organic EL display unit is expected to be the mainstream of flat panel displays in the next generation.

In the active-matrix type display unit, a current flowing through an organic EL element, of the organic EL device, provided for each pixel is controlled by a thin film transistor (TFT) that is provided in a pixel circuit provided for each organic EL element (see Japanese Unexamined Patent Application Publication No. 2008-33193).

SUMMARY

An organic EL element of an organic EL device is an electronic element that includes an anode electrode, a cathode electrode, and a thin film that is made of an organic compound and is provided between the anode electrode and the cathode electrode. In the organic EL element, the anode electrode and the cathode electrode inject holes and electrons, respectively. The holes and the electrons are recombined to each other and generate energy. The generated energy is taken out as light. Hence, an improvement in injection properties of the holes leads to a decrease in drive voltage, an improvement in light emitting efficiency, and the like.

In a case where the organic EL element is of a low molecular deposition type, when the organic EL elements are arranged in an array, light emitting layers are formed by selective deposition for respective pixels with use of a deposition mask. However, it is desirable to form layers other than the light emitting layers in the organic layer to be common to the pixels when taking into consideration productivity improvement and cost reduction. However, when a hole injection layer (HIL) is provided in common to the pixels, a leakage current occurs between the adjacent pixels due to low resistivity of the hole injection layer, and thereby, even pixels other than the desired pixel emit light. This disadvantageously results in color mixture and degradation in image quality.

It is desirable to provide a display panel, a display unit, and an electronic apparatus that are capable of reducing a leakage current between adjacent pixels.

According to an embodiment of the present technology, there is provided a display panel including: a plurality of pixels arranged in a display region, the pixels each including an organic EL element; and a plurality of electrically-conductive wiring layers each arranged between the pixels. The organic EL element includes a plurality of layers including a hole injection layer and a light emitting layer, the light emitting layer emitting light by recombination of an electron and a hole. The hole injection layer of the plurality of layers is common to the pixels in the display region and is electrically connected to the electrically-conductive wiring layers.

According to an embodiment of the present technology, there is provided a display unit including: a display panel including a plurality of pixels and a plurality of electrically-conductive wiring layers, the pixels being arranged in a display region and each including an organic EL element, the electrically-conductive wiring layers each being arranged between the pixels; and a drive circuit driving each of the pixels. The organic EL element includes a plurality of layers including a hole injection layer and a light emitting layer, the light emitting layer emitting light by recombination of an electron and a hole. The hole injection layer of the plurality of layers is common to the pixels in the display region and is electrically connected to the electrically-conductive wiring layers.

According to an embodiment of the present technology, there is provided an electronic apparatus including a display unit, the display unit including: a display panel including a plurality of pixels and a plurality of electrically-conductive wiring layers, the pixels being arranged in a display region and each including an organic EL element, the electrically-conductive wiring layers each being arranged between the pixels; and a drive circuit driving each of the pixels. The organic EL element includes a plurality of layers including a hole injection layer and a light emitting layer, the light emitting layer emitting light by recombination of an electron and a hole. The hole injection layer of the plurality of layers is common to the pixels in the display region and is electrically connected to the electrically-conductive wiring layer.

In the display panel, the display unit, and the electronic apparatus according to the embodiment of the present technology, at least the hole injection layer of the plurality of layers is electrically connected to the electrically-conductive wiring layers that are each arranged between the pixels. Thus, the leakage current is drawn by the electrically-conductive wiring layer before reaching an adjacent pixel.

According to the display panel, the display unit, and the electronic apparatus of the embodiment of the present technology, the leakage current is drawn by the electrically-conductive wiring layer before reaching the adjacent pixel. Therefore, occurrence of leakage current is suppressed between the adjacent pixels. As a result, color mixture, degradation in image quality, and the like are suppressed.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the technology.

FIGS. 11A and 11B are a front view and a side view of an application example 5 in an open state, respectively. FIGS. 11C to 11G are a front view, a left-side view, a right-side view, a top view, and a bottom view of the application example 5 in a closed state, respectively.

DETAILED DESCRIPTION

Hereinafter, a preferred embodiment of the present technology will be described in detail with reference to the drawings. The description will be given in the following order.
1. Embodiment (Display Unit)
    An example in which a metal wiring layer is provided between pixels
2. Application Examples (Electronic Apparatuses)
    Examples in which the display unit according to the embodiment is applied to electronic apparatuses

1. Embodiment

Configuration

Figure 1:
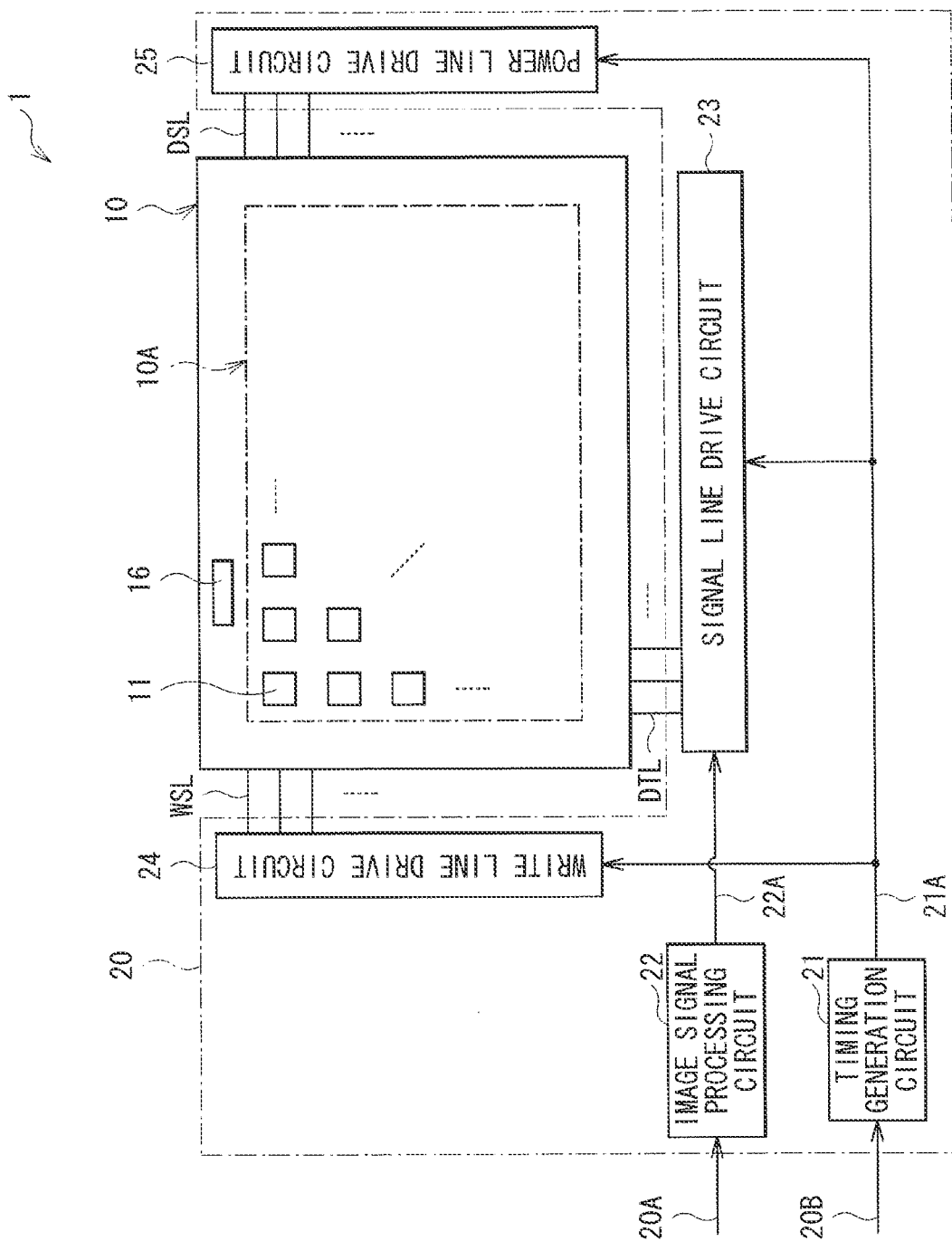
FIG. 1 is a diagram illustrating an example of a configuration of a display unit according to an embodiment of the present technology.

FIG. 1 illustrates a schematic configuration of a display unit 1 according to an embodiment of the present technology. The display unit 1 includes a display panel 10 and a drive circuit 20 that drives the display panel 10. The drive circuit 20 may include, for example, a timing generation circuit 21, an image signal processing circuit 22, a signal line drive circuit 23, a write line drive circuit 24, and a power line drive circuit 25.

[Display Panel 10]

The display panel 10 includes a plurality of pixels 11 that are two-dimensionally arranged over an entire display region 10A of the display panel 10. The pixel 11 corresponds to a dot of a minimum unit that configures a screen on the display panel 10. The pixel 11 corresponds, for example, to a subpixel that emits light of a single color such as red, green, and blue when the display panel 10 is a color display panel. The pixel 11 corresponds to a pixel that emits white light when the display panel 10 is a monochrome display panel.

Figure 2:
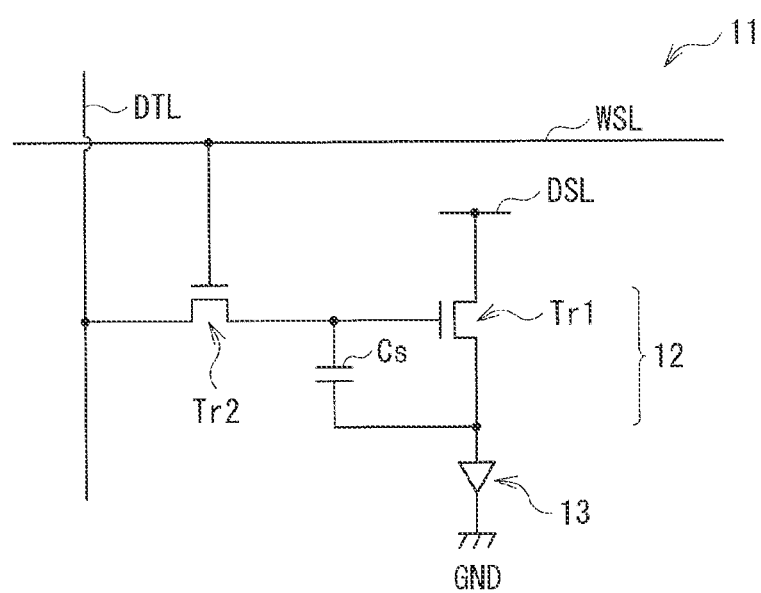
FIG. 2 is a diagram illustrating an example of a configuration of a pixel.

The display panel 10 displays an image based on an externally-inputted image signal 20A when each pixel 11 is active-matrix driven by the drive circuit 20. FIG. 2 illustrates an example of a circuit configuration of the pixel 11. The pixel 11 may include, for example, a pixel circuit 12 and an element 13 of an organic EL device (hereinafter simply referred to as "organic EL element 13") as shown in FIG. 2.

The pixel circuit 12 may have, for example, a circuit configuration of 2Tr1C that includes a driving transistor Tr1, a writing transistor Tr2, and a capacitor Cs as shown in FIG. 2. The writing transistor Tr2 samples a voltage of a later-described signal line DTL and writes the sampled voltage to a gate of the driving transistor Tr1. The driving transistor Tr1 controls a current that flows through the organic EL element 13, according to a magnitude of the voltage written by the writing transistor Tr2. The capacitor Cs holds a predetermined voltage between the gate and a source of the driving transistor Tr1. It is to be noted that the pixel circuit 12 may have a circuit configuration different from the above-described circuit configuration of 2Tr1C.

The driving transistor Tr1 and the writing transistor Tr2 may include, for example, an n-channel MOS type thin film transistor (TFT). It is to be noted that, the type of the TFT is not specifically limited. The TFT may have, for example, an inverse staggered structure (bottom gate type) or may have a staggered structure (top gate type). The driving transistor Tr1 and the writing transistor Tr2 each may also be a p-channel MOS type TFT.

The display panel 10 includes a plurality of write lines WSL that extend in a row direction, a plurality of signal lines DTL that extend in a column direction, and a plurality of power lines DSL that extend in the row direction, as shown in FIG. 2. The pixel 11 is provided in vicinity of an intersection of each signal line DTL and each write line WSL. Each signal line DTL is connected to an output terminal (not illustrated) of the later-described signal line drive circuit 23, and to a source or a drain of the writing transistor Tr2. Each write line WSL is connected to an output terminal (not illustrated) of the later-described write line drive circuit 24, and to a gate of the writing transistor Tr2. Each power line DSL is connected to an output terminal (not illustrated) of an electric power source that supplies a fixed voltage, and to the source or a drain of the driving transistor Tr1.

The gate of the writing transistor Tr2 is connected to the write line WSL. One of the source and the drain of the writing transistor Tr2 is connected to the signal line DTL, and the other thereof which is not connected to the signal line DTL is connected to the gate of the driving transistor Tr1. One of the source and the drain of the driving transistor Tr1 is connected to the power line DSL, and the other thereof which is not connected to the power line DSL is connected to an anode of the organic EL element 13. One end of the capacitor Cs is connected to the gate of the driving transistor Tr1 and the other end of the capacitor Cs is connected to the source (the terminal closer to the organic EL element 13 in FIG. 2) of the driving transistor Tr1. In other words, the capacitor Cs is inserted between the gate and the source of the driving transistor Tr1. A cathode of the organic EL element 13 is connected to the ground line GND. The ground line GND is electrically connected to an external circuit (not illustrated) that has a base potential (for example, a ground potential).

[Structure in Display Panel 10]

Figure 3:
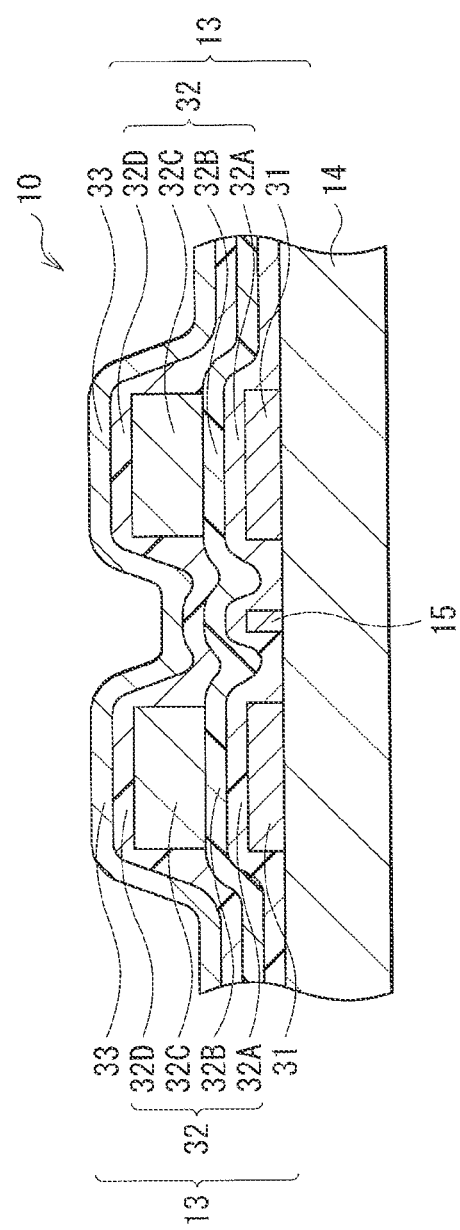
FIG. 3 is a diagram illustrating an example of a cross-sectional configuration of an organic EL element.

Next, description will be given of a structure in the display panel 10 with reference to FIG. 3. FIG. 3 illustrates an example of a cross-sectional configuration of the organic EL element 13 and the vicinity thereof in the display panel 10. The display panel 10 may include, for example, on a TFT substrate 14, a plurality of organic EL elements 13 corresponding to the respective pixels 11, and metal wiring layers 15 each provided between the pixels 11 (specifically, between the adjacent organic EL elements 13) as shown in FIG. 3.

The TFT substrate 14 includes the pixel circuit 12 and the like formed thereon. The TFT substrate 14 also includes a metal layer (not illustrated) that is electrically connected to the pixel circuit 12 at least on an uppermost surface. The organic EL element 13 is in contact with the metal layer. The metal wiring layer 15 is a strip-shaped wiring layer that extends in the row direction or in the column direction in the display region 10A. The metal wiring layer 15 is electrically connected to a metal member 16 (see FIG. 1) provided outside the display region 10A. The metal member 16 receives a voltage smaller than a threshold voltage of the organic EL element 13. Here, the voltage applied to the metal member 16 is the same as the ground voltage or a voltage of the cathode of the organic EL element 13. The metal wiring layer 15 may, for example, be formed in the same layer as that including a later-described anode electrode 31 and be in contact with a bottom surface of a later-described hole injection layer 32A. Further, the metal wiring layer 15 may, for example, be formed collectively with the anode electrode 31 in the same formation process. It is preferable that the metal wiring layer 15 be sufficiently away from the end of the anode electrode 31. For example, the metal wiring layer 15 may preferably be arranged at an intermediate position between the adjacent anode electrodes 31. It is to be noted that the metal wiring layer 15 may be formed in a layer that is different from a layer including the anode electrode 31 and is capable of being in contact with the hole injection layer 32A. Further, the metal wiring layer 15 may have a configuration capable of being electrically connected at least to the hole injection layer 32A out of the hole injection layer 32A, a later-described hole transport layer 32B, and a later-described electron transport layer 32D.

The organic EL element 13 may include, for example, the anode electrode 31 provided closer to the TFT substrate 14, an organic layer 32 provided on the anode electrode 31, and a cathode electrode 33 provided on the organic layer 32, as shown in FIG. 3. The anode electrode 31 injects holes to the organic layer 32. The anode electrode 31 may be configured of, for example, a material having favorable hole injection properties such as Al-based metal. "Al-based metal" is a concept including Al, an alloy thereof, and the like. The organic layer 32 emits light with brightness according to the amount of a current that flows in the organic layer 32. The organic layer 32 may have, for example, a lamination structure including the hole injection layer 32A, the hole transport layer 32B, a light emitting layer 32C, and the electron transport layer 32D in this order of closeness to the anode electrode 31. The hole injection layer 32A increases hole injection efficiency. The hole transport layer 32B increases efficiency of hole transport to the later-described light emitting layer 32C. The light emitting layer 32C emits light by recombination of electrons and holes. The electron transport layer 32D increases efficiency of electron transport to the light emitting layer 32C. The cathode electrode 33 injects electrons to the organic layer 32. The cathode electrode 33 may be configured of a material having favorable electron injection properties, for example, a semi-transmissive metal material such as MgAg.

All of the layers in the organic layer 32 except the light emitting layer 32C are formed over the entire region that includes all of the pixels 11 in the display region 10A. On the other hand, the light emitting layer 32C is selectively formed for each organic EL element 13. The light emitting layer 32C may be selectively formed, for example, for each region facing the anode electrode 31. Here, the hole transport layer 32B and the electron transport layer 32D are common to all of the pixels 11. However, the hole transport layer 32B and the electron transport layer 32D each have resistivity larger than that of the hole injection layer 32A and have small thickness, thereby having large resistance in an in-plane direction of the lamination. Therefore, although the hole transport layer 32B and the electron transport layer 32D are indeed common to all of the pixels 11, the hole transport layer 32B and the electron transport layer 32D are electrically separated for each pixel 11 in fact.

On the other hand, the hole injection layer 32A has a slightly small resistivity compared to that of the hole transport layer 32B and of the electron transport layer 32D. However, the hole injection layer 32A is in contact with the metal wiring layer 15 provided between the pixels 11. Here, the metal wiring layer 15 is in contact with the metal member 16 to which a voltage smaller than the threshold voltage of the organic EL element 13 is applied. Therefore, the metal wiring layer 15 draws, from the hole injection layer 32A, the current that flows from one to the other of the adjacent pixels 11 in the hole injection layer 32A.

Figure 4:
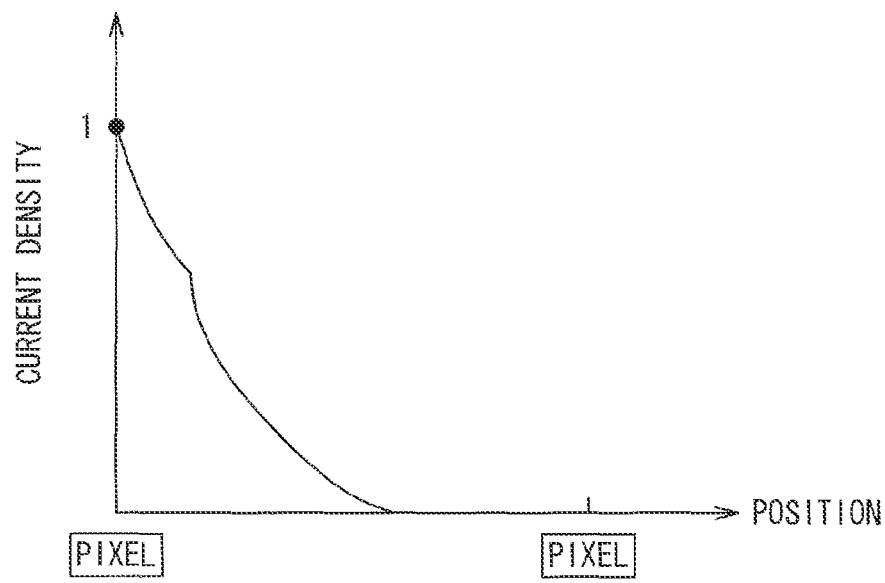
FIG. 4 is a diagram for explaining a leakage current between pixels in a display panel shown in FIG. 1.
Figure 5:
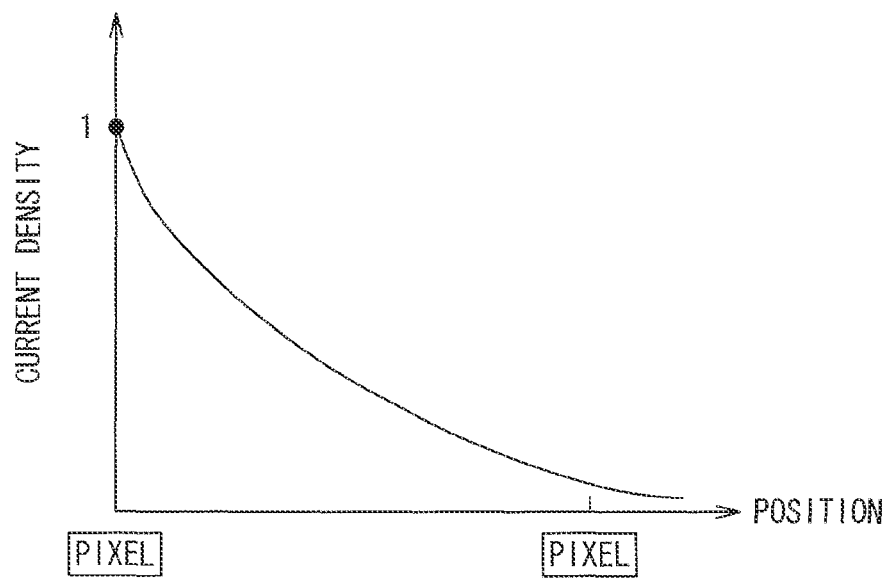
FIG. 5 is a diagram for explaining a leakage current between pixels in a display panel according to a comparative example.

FIGS. 4 and 5 each illustrate the leakage current flowing between the pixels with use of current density distribution. FIGS. 4 and 5 specifically illustrate distribution of current density around a pixel on the left side of the drawings when that pixel emits light. FIG. 4 illustrates an example of the current density distribution when the hole injection layer 32A is in contact with the metal wiring layer 15 between the pixels 11. FIG. 5 illustrates an example of the current density distribution when the metal wiring layer 15 is not provided. In FIGS. 4 and 5, the current density indicated on the vertical axis is normalized with the density of the current flowing through the pixel on the left side of the drawings when that pixel emits light.

In FIG. 4, the current density varies discontinuously and decreases drastically at a position of the metal wiring layer 15. Therefore, the leakage current from the pixel emitting light does not reach the pixel (the pixel on the right side of FIG. 4) adjacent to the pixel emitting light. On the other hand, in FIG. 5, the current density gently decreases with increasing distance from the pixel emitting light. Therefore, the leakage current from the pixel emitting light reaches the pixel (the pixel on the right side of FIG. 4) adjacent to the pixel emitting light. Accordingly, it can be seen that the high resistance structure of the hole injection layer 32A effectively blocks the leakage current from the pixel emitting light.

[Drive Circuit 20]

Next, short description will be given of the drive circuit 20. The drive circuit 20 may include, for example, the timing generation circuit 21, the image signal processing circuit 22, the signal line drive circuit 23, the write line drive circuit 24, and the power line drive circuit 25 as described above and as shown in FIG. 1. The timing generation circuit 21 so controls each of the circuits in the drive circuit 20 that the circuits operate in conjunction with one another. The timing generation circuit 21 outputs a control signal 21A to each of the above-described circuits in response to (in synchronization with) a synchronization signal 20B which is externally inputted, for example.

The image signal processing circuit 22 corrects the digital image signal 20A which is externally inputted, and converts the corrected image signal to an analog signal to be outputted to the signal line drive circuit 23. The signal line drive circuit 23 outputs, to each signal line DTL, the analog image signal supplied from the image signal processing circuit 22, in response to (in synchronization with) input of the control signal 21A. The write line drive circuit 24 sequentially selects the plurality of write lines WSL by a predetermined unit in response to (in synchronization with) the input of the control signal 21A. The power line drive circuit 25 may sequentially select the plurality of power lines DSL by a predetermined unit in response to (in synchronization with) the input of the control signal 21A.

[Effects]

Next, description will be given of effects of the display unit 1 according to the present embodiment.

In the case where the organic EL element is of a low molecular deposition type, when the organic EL elements are arranged in an array, the light emitting layer is typically formed by selective deposition for each pixel with use of a deposition mask. However, layers other than the light emitting layer in the organic layer are desirably formed to be common to the pixels when taking into consideration productivity improvement and manufacturing cost reduction. However, when the hole injection layer is formed to be common to the pixels, the leakage current occurs between the adjacent pixels due to low resistivity of the hole injection layer. For example, the leakage current from the pixel emitting light reaches the pixel (the pixel on the right side of FIG. 5) adjacent to that pixel emitting light as shown in FIG. 5. Therefore, even a pixel other than the desired pixel emits light. This leads to color mixture and degradation in image quality.

On the other hand, in the present embodiment, at least the hole injection layer 32A out of the hole injection layer 32A, the hole transport layer 32B, and the electron transport layer 32D is electrically connected to the metal wiring layer 15 that is arranged between the pixels 11. Thus, the leakage current is drawn by the metal wiring layer 15 before reaching the adjacent pixel. As a result, for example, as illustrated in FIG. 4, the current density drastically decreases at the position of the metal wiring layer 15, and therefore, the occurrence of leakage current is suppressed between the adjacent pixels 11. Accordingly, color mixture, degradation in image quality, and the like are suppressed.

2. Application Examples

Hereinafter, description will be given of application examples of the display unit 1 described in the foregoing embodiment. The above-described display unit 1 is applicable to a display unit of an electronic apparatus in any field that displays an externally-inputted or internally-generated image signal as an image. Examples of such an electronic apparatus include televisions, digital cameras, notebook personal computers, portable terminal devices such as mobile phones, and video camcorders.

[Module]

Figure 6:
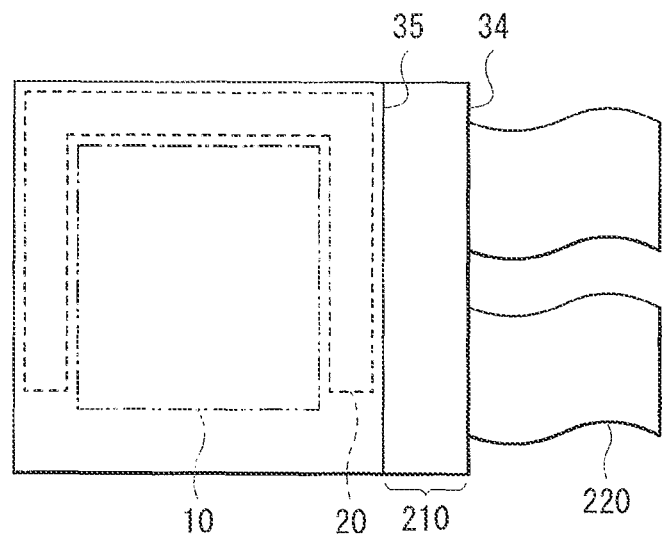
FIG. 6 is a plan view illustrating a schematic configuration of a module that includes the display unit according to the embodiment.

The above-described display unit 1 may be mounted as a module shown in FIG. 6 on various electronic apparatuses such as the later-described application examples 1 to 5, for example. The module may include, for example, a region 210 exposed from a sealing substrate 35 on one side of a substrate 34, and includes an external connection terminal (not illustrated) that is provided on the exposed region 210 and is an extension of the wirings in the drive circuit 20. The external connection terminal may include a flexible printed circuit (FPC) 220 for input and output of signals.

Application Example 1

Figure 7:
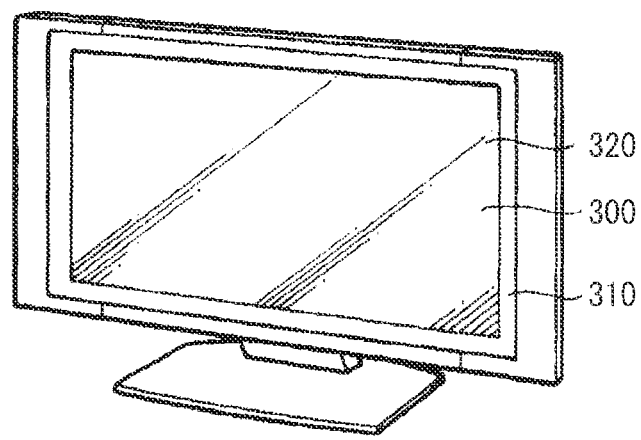
FIG. 7 is a perspective view illustrating an appearance of an application example 1 of the display unit according to the embodiment.

FIG. 7 illustrates an appearance of a television to which the above-described display unit 1 is applied. The television may include, for example, an image display screen section 300 that has a front panel 310 and a filter glass 320. The image display screen section 300 may be configured of the above-described display unit 1, for example.

Application Example 2

Figure 8A:
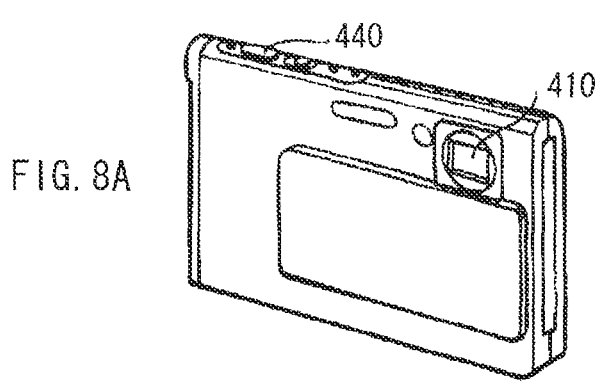
FIGS. 8A and 8B are perspective views illustrating an appearance of an application example 2 seen from the front side thereof and the back side thereof, respectively.
Figure 8B:
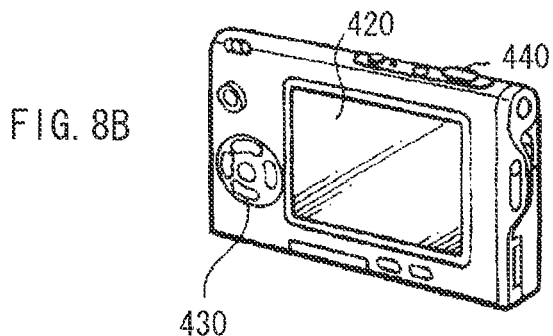

FIGS. 8A and 8B illustrate an appearance of a digital camera to which the above-described display unit 1 is applied. The digital camera may include, for example, a light emitting section 410 for a flash, a display section 420, a menu switch 430, and a shutter button 440. The display section 420 may be configured of the above-described display unit 1, for example.

Application Example 3

Figure 9:
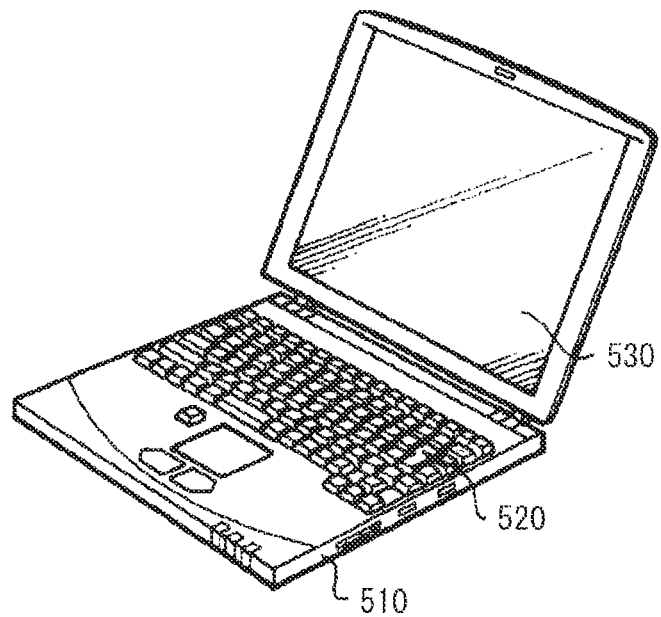
FIG. 9 is a perspective view illustrating an appearance of an application example 3.

FIG. 9 illustrates an appearance of a notebook personal computer to which the above-described display unit 1 is applied. The notebook personal computer may include, for example, a main body 510, a keyboard 520 for input operation of characters and the like, and a display section 530 that displays an image. The display section 530 may be configured of the above-described display unit 1, for example.

Application Example 4

Figure 10:
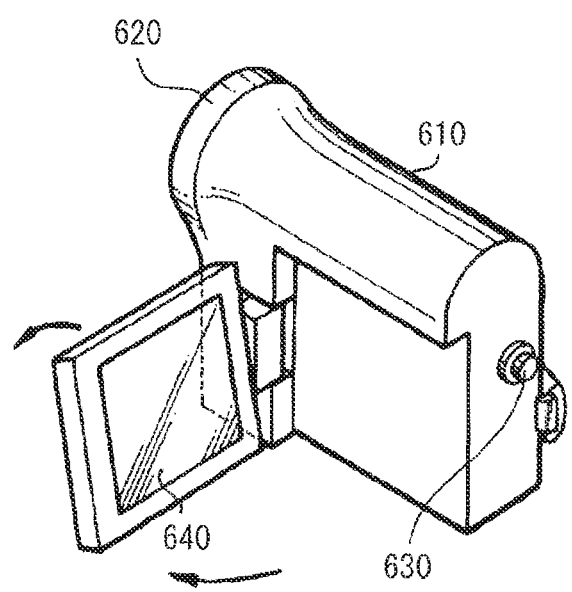
FIG. 10 is a perspective view illustrating an appearance of an application example 4.

FIG. 10 illustrates an appearance of a video camcorder to which the above-described display unit 1 is applied. The video camcorder may include, for example, a main body section 610, a lens 620 provided on the front side of the main body section 610 for shooting a subject, a start-and-stop switch 630 used at shooting, and a display section 640. The display section 640 may be configured of the above-described display unit 1, for example.

Application Example 5

FIGS. 11A to 11G illustrate an appearance of a mobile phone to which the above-described display unit 1 is applied. The mobile phone may include, for example, a top housing 710 and a bottom housing 720 that are connected with a connection section (hinge section) 730, a display 740, a sub-display 750, a picture light 760, and a camera 770. Each of the display 740 and the sub-display 750 may be configured of the above-described display unit 1, for example.

Description of the present technology has been given hereinabove with reference to the embodiment, and the application examples. However, the present technology is not limited to the above-described embodiment and the like and may be variously modified.

For example, the case where the display unit 1 is of an active matrix type is explained in the foregoing embodiment and the like. However, the configuration of the pixel circuit 12 for active matrix drive is not limited to that described above in the embodiment and the like, and components such as a capacitor and a transistor may be added to the pixel circuit 12 as necessary. In this case, necessary drive circuits may be provided in addition to the signal line drive circuit 23, the write line drive circuit 24, and the power line drive circuit 25 that are described above, according to the change in the pixel circuit 12.

Moreover, for example, the timing generation circuit 21 controls the drive of each of the image signal processing circuit 22, the signal line drive circuit 23, the write line drive circuit 24, and the power line drive circuit 25 in the above-described embodiments and the like. However, a circuit other than the timing generation circuit 21 may control the drive of the above-mentioned circuits. Further, either hardware (circuit) or software (program) may be used to control the image signal processing circuit 22, the signal line drive circuit 23, the write line drive circuit 24, and the power line drive circuit 25.

It is possible to achieve at least the following configurations from the above-described example embodiments and the modifications of the disclosure.

(1) A display panel including:
a plurality of pixels arranged in a display region, the pixels each including an organic EL element; and
a plurality of electrically-conductive wiring layers each arranged between the pixels, wherein
the organic EL element includes a plurality of layers including a hole injection layer and a light emitting layer, the light emitting layer emitting light by recombination of an electron and a hole, and
the hole injection layer of the plurality of layers is common to the pixels in the display region and is electrically connected to the electrically-conductive wiring layers.

(2) The display panel according to (1), wherein each of the electrically-conductive wiring layers is arranged between the pixels to which the hole injection layer is common.

(3) The display panel according to (1) or (2), wherein each of the electrically-conductive wiring layers is in contact with a metal member provided outside the display region, and
a first voltage is applied to the metal member, the first voltage being smaller than a threshold voltage of the organic EL element.

(4) The display panel according to (3), wherein the first voltage is a voltage same as one of a ground voltage and a voltage of a cathode of the organic EL element.

(5) The display panel according to any one of (1) to (4), wherein the hole injection layer is common to all of the pixels in the display region.

(6) The display panel according to any one of (1) to (5), wherein the plurality of layers further includes a hole transport layer and an electron transport layer.

(7) A display unit including:
a display panel including a plurality of pixels and a plurality of electrically-conductive wiring layers, the pixels being arranged in a display region and each including an organic EL element, the electrically-conductive wiring layers each being arranged between the pixels; and
a drive circuit driving each of the pixels, wherein
the organic EL element includes a plurality of layers including a hole injection layer and a light emitting layer, the light emitting layer emitting light by recombination of an electron and a hole, and
the hole injection layer of the plurality of layers is common to the pixels in the display region and is electrically connected to the electrically-conductive wiring layers.

(8) An electronic apparatus including a display unit, the display unit including:
a display panel including a plurality of pixels and a plurality of electrically-conductive wiring layers, the pixels being arranged in a display region and each including an organic EL element, the electrically-conductive wiring layers each being arranged between the pixels; and
a drive circuit driving each of the pixels, wherein
the organic EL element includes a plurality of layers including a hole injection layer and a light emitting layer, the light emitting layer emitting light by recombination of an electron and a hole, and
the hole injection layer of the plurality of layers is common to the pixels in the display region and is electrically connected to the electrically-conductive wiring layers.

The present application contains subject matter related to that disclosed in Japanese Priority Patent Application JP2011-230127 filed in the Japan Patent Office on Oct. 19, 2011, the entire content of which is hereby incorporated by reference.

It should be understood by those skilled in the art that various modifications, combinations, sub-combinations, and alterations may occur depending on design requirements and other factors insofar as they are within the scope of the appended claims or the equivalents thereof.

What is claimed is:

1. A display panel comprising:
a plurality of sub-pixels arranged in a display region, the plurality of sub-pixels each including an organic EL element; and
an electrically-conductive wiring arranged between at least two sub-pixels of the plurality of sub-pixels, wherein
the organic EL element of each of the plurality of sub-pixels includes at least an anode, a hole injection layer, a light emitting layer, and a cathode, the light emitting layer emitting light by recombination of an electron and a hole, and
the hole injection layer of each of the at least two sub-pixels is part of a single integral layer that is shared in common by the at least two sub-pixels and that is directly electrically connected to the electrically-conductive wiring.

2. The display panel according to claim 1, further comprising:
a driving unit configured to supply control signals to the plurality of sub-pixels,
wherein the electrically-conductive wiring is in direct electrical contact with a metal member provided outside the display region, and
the driving unit is configured to apply a first voltage to the metal member during a light emission operation, the first voltage being smaller than a threshold voltage of the organic EL element.

3. The display panel according to claim 2, wherein the first voltage is a voltage same as one of a ground voltage and a voltage that is applied to the cathode of the organic EL element during the light emission operation.

4. The display panel according to claim 1, wherein the hole injection layer of each of the plurality of sub-pixels is part of the single integral layer, the single integral layer being shared in common by all of the plurality of sub-pixels in the display region.

5. The display panel according to claim 1, wherein the organic EL element of each of the plurality of sub-pixels further includes a hole transport layer and an electron transport layer.

6. The display panel according to claim 4, further comprising:
a plurality of electrically-conductive wirings, including the electrically-conductive wiring, wherein each of the plurality of electrically-conductive wirings is arranged between adjacent ones of the plurality of sub-pixels.

7. The display panel according to claim 4, further comprising:
a plurality of electrically-conductive wirings, including the electrically-conductive wiring,
wherein the plurality of sub-pixels are arranged in rows and columns, each of the plurality of electrically-conductive wirings extends across the display region a column direction, and one of the plurality of electrically-conductive wirings is arranged between each pair of adjacent columns of sub-pixels.

8. The display panel according to claim 1,
wherein the organic EL element of each of the plurality of sub-pixels is formed on a substrate, and the electrically-conductive wiring and the anode are a same number of layers above the substrate as each other.

9. A display unit comprising:
the display panel of claim 1, and
a drive circuit driving each of the plurality of sub-pixels.

10. An electronic apparatus comprising the display unit of claim 9.

11. A display panel comprising:
a plurality of sub-pixels arranged in rows and columns in a display region, the plurality of sub-pixels each including an organic EL element that includes at least an anode, a hole injection layer, a light emitting layer, and a cathode, the light emitting layer emitting light by recombination of an electron and a hole; and
a plurality of electrically-conductive wirings arranged such that at least one is provided between each pair of adjacent columns of sub-pixels,
wherein the hole injection layer of each of the plurality of sub-pixels is part of a single integral layer that is shared in common by all of the plurality of sub-pixels and that is directly electrically connected to each of the plurality of the electrically-conductive wirings.

12. The display panel of claim 11, further comprising:
a driving unit configured to supply control signals to the plurality of sub-pixels,
wherein each of the plurality of electrically-conductive wiring layers are directly electrically connected to a metal member provided outside the display region, and
the driving unit is configured to apply a first voltage to the metal member during a light emission operation, the first voltage being smaller than a threshold voltage of the organic EL element.

13. The display panel of claim 12,
wherein the first voltage is at least one of a ground voltage and a voltage that is applied to the cathode of the organic EL element during the light emission operation.

14. A display unit comprising:
the display panel of claim 11, and
a drive circuit driving each of the plurality of sub-pixels.

15. An electronic apparatus comprising the display unit of claim 14.

16. A method of manufacturing a display panel, comprising:
providing a substrate;
forming a plurality of sub-pixel circuits on the substrate,
forming an anode for each of the plurality of sub-pixel circuits, the anodes being arranged in rows and columns;
forming a plurality of electrically-conductive wirings arranged such that at least one is provided between each pair of adjacent columns of anodes;
forming a single integral hole injection layer shared in common by all of the plurality of sub-pixel circuits, the single integral hole injection layer being directly electrically connected to each of the plurality of electrically-conductive wirings,
for each of the plurality of sub-pixel circuits, forming a light emitting layer and a cathode such that the light emitting layer and a corresponding portion of the single integral hole-injection layer are sandwiched between the cathode and the anode, thereby forming an organic EL element that emits light by recombination of electrons and holes in the light emitting layer.

17. The method of claim 16,
wherein the anodes and the plurality of electrically-conductive wirings are formed from a same integral material layer deposited on the substrate.

18. The method of claim 16, further comprising:
forming, for each of the plurality of sub-pixel circuits, a hole transport layer and an electron transport layer as part of the organic EL element of each the sub-pixel circuit.

19. The method of claim 18,
wherein the hole transport layer of each of the plurality of sub-pixel circuits is part of a single integral hole transport layer shared in common by all of the plurality of sub-pixel circuits; and
wherein the electron transport layer of each of the plurality of sub-pixel circuits is part of a single integral electron transport layer shared in common by all of the plurality of sub-pixel circuits.

20. The method of claim 16,
wherein the cathode electrode of each of the plurality of sub-pixel circuits is part a single integral cathode layer shared in common by all of the plurality of sub-pixel circuits.

21. The method of claim 17,
wherein the integral material layer is separated into isolated portions after having been deposited on the substrate to form the anodes and the plurality of electrically-conductive wirings such that none of the anodes are directly electrically connected to the electrically-conductive wirings.

22. The display panel of claim 1,
wherein the electrically-conductive wiring is arranged between the respective anodes of the at least two sub-pixels.

23. The display panel of claim 22,
wherein the electrically-conductive wiring is arranged half way between the respective anodes of the at least two sub-pixels.

24. A display panel comprising:
a plurality of sub-pixels arranged in rows and columns in a display region, the plurality of sub-pixels each including an organic EL element that includes at least an anode, a hole injection layer, a light emitting layer, and a cathode, the light emitting layer emitting light by recombination of an electron and a hole;
a plurality of electrically-conductive wirings that are each arranged between a pair of adjacent sub-pixels, and
a driving unit configured to supply control signals to the plurality of sub-pixels,
wherein the hole injection layer of each of the plurality of sub-pixels is part of a single integral layer that is shared in common by all of the plurality of sub-pixels and that is electrically connected to each of the plurality of the electrically-conductive wirings, and
wherein the driving unit is configured to apply a first potential to the plurality of electrically-conductive wirings during a light emission operation, the first potential being different from a potential of the anode electrode during the light emission operation.

25. The display panel of claim 24,
wherein the first potential equals a potential applied to the respective cathodes of the plurality of sub-pixels during a light emission operation.

* * * * *